(12) United States Patent
Yamashita et al.

(10) Patent No.: US 7,719,100 B2
(45) Date of Patent: May 18, 2010

(54) POWER SEMICONDUCTOR MODULE WITH MOS CHIP

(75) Inventors: Shiro Yamashita, Fujisawa (JP); Shinichi Fujiwara, Kamakura (JP); Shosaku Ishihara, Chigasaki (JP); Hideto Yoshinari, Tokai (JP)

(73) Assignee: Hitachi, Ltd., Tokyo (JP)

( * ) Notice: Subject to any disclaimer, the term of this patent is extended or adjusted under 35 U.S.C. 154(b) by 722 days.

(21) Appl. No.: 11/528,672

(22) Filed: Sep. 28, 2006

(65) Prior Publication Data
US 2007/0069344 A1  Mar. 29, 2007

(30) Foreign Application Priority Data
Sep. 29, 2005 (JP) .............................. 2005-283260

(51) Int. Cl.
H01L 23/48 (2006.01)
H01L 21/00 (2006.01)

(52) U.S. Cl. .................. 257/692; 257/693; 257/779; 438/123

(58) Field of Classification Search .................. None
See application file for complete search history.

(56) References Cited

U.S. PATENT DOCUMENTS 6,452,802 B2 *  9/2002  Lam et al. .................. 361/704
7,443,014 B2 * 10/2008  Otremba .................. 257/676

FOREIGN PATENT DOCUMENTS

| JP | 9-36186 | 2/1997 |
|----|---------|--------|
| JP | 2001-110957 | 4/2001 |
| JP | 3627591 | 12/2004 |

OTHER PUBLICATIONS

Mate 2005, 11$^{th}$ Symposium on "Microjoining and Assembly Technology in Electronics", Feb. 2005., Nakajima, et al. pp. 433-436.

* cited by examiner

*Primary Examiner*—Alonzo Chambliss
(74) *Attorney, Agent, or Firm*—Mattingly & Malur, P.C.

(57) ABSTRACT

To prevent any uneven solder wetting in a main surface of electrodes of a semiconductor connected with a main surface of a planar lead and any displacement of the lead vis-a-vis the electrodes due to the reflow of the solder in a semiconductor module having the semiconductor element mounted on a substrate and the planar lead electrically connected therewith, the present invention provides an improved semiconductor module characterized in that the width of at least a part of the region of the main surface of the lead facing the semiconductor element is expanded wider than or equal to the width of the electrodes formed on the semiconductor element, and preferably the other part of the main surface of the lead soldered to an electrode formed on the substrate is split in the extending direction thereof.

10 Claims, 11 Drawing Sheets

FIG.8

| Lead I (basic structure) | | | | | |
|---|---|---|---|---|---|
| | | Sample # | Displacement amount of lead | | |
| | | | 0mm | 0.2mm | 0.5mm |
| Displacement amount of solder sheet | 0mm | (1) | 0/5 | 0/5 | 0/5 |
| | | (2) | 0/5 | 0/5 | 0/5 |
| | | (3) | 0/5 | 0/5 | 0/5 |
| | | (4) | 0/5 | 0/5 | 0/5 |
| | | (5) | 0/5 | 0/5 | 0/5 |
| | 0.2mm | (1) | 0/5 | 0/5 | 0/5 |
| | | (2) | 0/5 | 0/5 | 0/5 |
| | | (3) | 0/5 | 0/5 | 0/5 |
| | | (4) | 0/5 | 0/5 | 0/5 |
| | | (5) | 0/5 | 0/5 | 0/5 |
| | 0.5mm | (1) | 0/5 | 0/5 | 0/5 |
| | | (2) | 0/5 | 0/5 | 0/5 |
| | | (3) | 0/5 | 0/5 | 0/5 |
| | | (4) | 0/5 | 0/5 | 0/5 |
| | | (5) | 0/5 | 0/5 | 0/5 |

Indicated by the number of samples displaced after reflow/the number of samples evaluated

| Lead II (gate pad portion thereof is cut off) | | | |
|---|---|---|---|
| Sample # | (1) | (2) | (3) |
| W | 4.9 | 5.1 | 5.4 |
| $W_1$ | 2.0 | 2.1 | 2.25 |
| $W_2$ | 0.9 | ← | ← |
| $W_3$ | 0.5 | ← | ← |
| L | 15 | ← | ← |
| $L_1$ | 1.5 | ← | ← |
| $L_2$ | 2.0 | ← | ← |
| t | 0.3 | ← | ← |

(Unit: mm)

| Lead III (partially wide structure) | | | |
|---|---|---|---|
| Sample # | (1) | (2) | (3) |
| W | 4.9 | 5.1 | 5.4 |
| $W_1$ | 2.0 | ← | ← |
| $W_2$ | 0.9 | ← | ← |
| $W_3$ | 0 | 0.2 | 0.5 |
| L | 15 | ← | ← |
| $L_1$ | 1.5 | ← | ← |
| $L_2$ | 2.0 | ← | ← |
| t | 0.3 | ← | ← |

(Unit: mm)

FIG.11
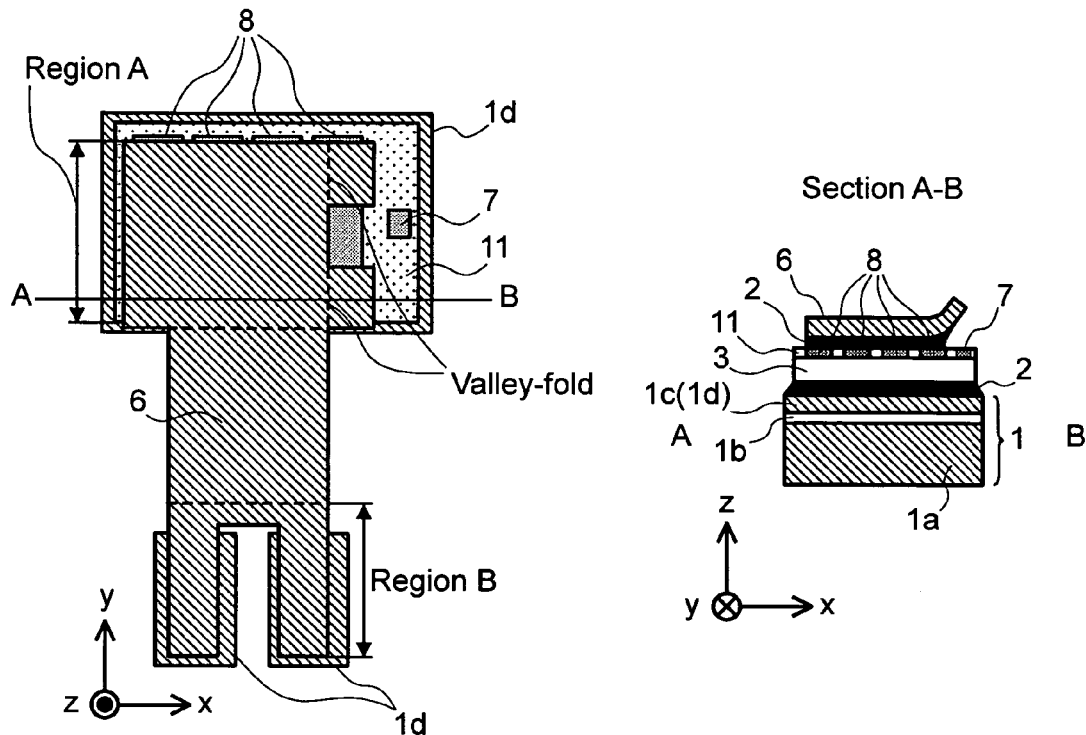
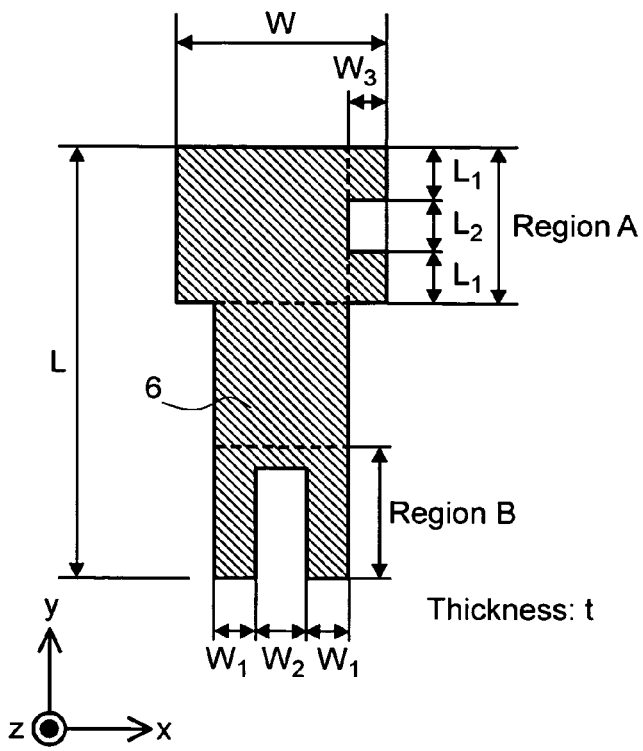
| Lead IV (valley-fold structure) | |
|---|---|
| Sample # | (1) |
| W | 5.4 |
| $W_1$ | 2.0 |
| $W_2$ | 0.9 |
| $W_3$ | 0.5 |
| L | 15 |
| $L_1$ | 1.5 |
| $L_2$ | 2.0 |
| t | 0.3 |
(Unit: mm)

FIG.12

| Lead II (gate pad portion thereof is cut off) | | Sample # | Displacement amount of the lead | | |
|---|---|---|---|---|---|
| | | | 0mm | 0.2mm | 0.5mm |
| Displacement amount of the solder sheet | 0mm | (1) | 0/5 | 0/5 | 0/5 |
| | | (2) | 0/5 | 0/5 | 0/5 |
| | | (3) | 0/5 | 0/5 | 0/5 |
| | 0.2mm | (1) | 0/5 | 0/5 | 0/5 |
| | | (2) | 0/5 | 0/5 | 0/5 |
| | | (3) | 0/5 | 0/5 | 0/5 |
| | 0.5mm | (1) | 0/5 | 0/5 | 0/5 |
| | | (2) | 0/5 | 0/5 | 0/5 |
| | | (3) | 0/5 | 0/5 | 0/5 |

Indicated by the number of samples displaced after reflow/the number of samples evaluated

| Lead III (partially wide structure) | | Sample # | Displacement amount the of lead | | |
|---|---|---|---|---|---|
| | | | 0mm | 0.2mm | 0.5mm |
| Displacement amount of the solder sheet | 0mm | (1) | 0/5 | 0/5 | 0/5 |
| | | (2) | 0/5 | 0/5 | 0/5 |
| | | (3) | 0/5 | 0/5 | 0/5 |
| | 0.2mm | (1) | 0/5 | 0/5 | 0/5 |
| | | (2) | 0/5 | 0/5 | 0/5 |
| | | (3) | 0/5 | 0/5 | 0/5 |
| | 0.5mm | (1) | 0/5 | 0/5 | 0/5 |
| | | (2) | 0/5 | 0/5 | 0/5 |
| | | (3) | 0/5 | 0/5 | 0/5 |

Indicated by the number of samples displaced after reflow/the number of samples evaluated

| Lead IV (Valley-fold structure) | | Sample # | Displacement amount the of lead | | |
|---|---|---|---|---|---|
| | | | 0mm | 0.2mm | 0.5mm |
| Displacement amount of the solders sheet | 0mm | (1) | 0/5 | 0/5 | 0/5 |
| | 0.2mm | (1) | 0/5 | 0/5 | 0/5 |
| | 0.5mm | (1) | 0/5 | 0/5 | 0/5 |

Indicated by the number of sampled displaced after reflow/the number of samples evaluated

FIG.14
PRIOR ART
(a)
PRIOR ART
(b)
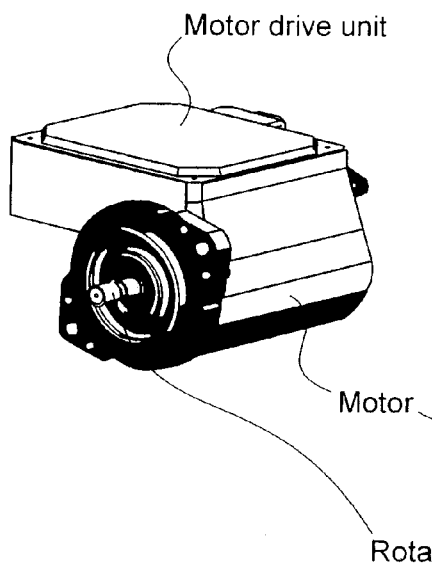
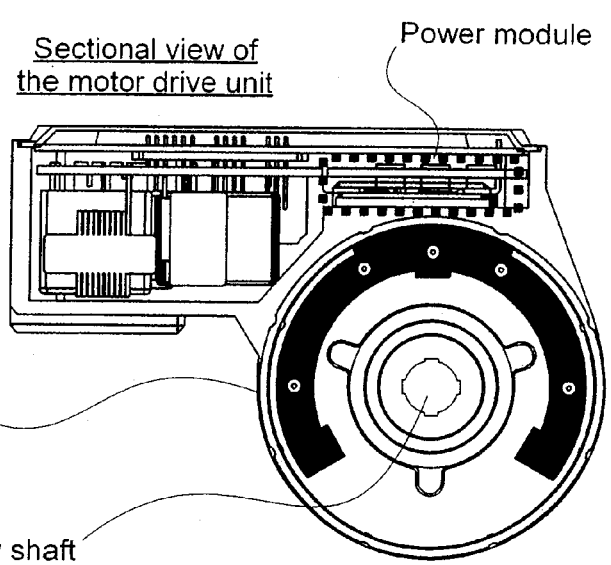

POWER SEMICONDUCTOR MODULE WITH MOS CHIP

The present application claims priority from Japanese application JP2005-283260 filed on Sep. 29, 2005, the content of which is hereby incorporated by reference into this application.

BACKGROUND OF THE INVENTION

1. Field of the Invention

The present invention relates to the lead connection with the substrate and the semiconductor element mounted thereon in semiconductor modules such as power modules mounted on electric apparatuses for automobile.

2. Description of the Related Art

Lately electronic devices have been introduced for controlling various electric apparatuses in automobiles and other vehicles. An example of electric apparatus incorporating an electronic device is an electric power steering unit shown in FIG. 14(a). In the device, a housing containing a motor relating with the steering of the automobile has a motor drive unit on which electric devices are mounted. FIG. 14(b) is a sectional view of the motor and the motor drive unit cut along a plane crossing the rotary shaft of this motor. The above-mentioned electric device is mounted on the motor drive unit as a power module.

The power module is constituted as a so-called semiconductor module with a power element such as IGBT (Insulated Gate Bipolar Transistor) suitable for controlling electric apparatuses driven by a relatively large current such as an electric power steering device mounted thereon. This type of power module is also called "an in-vehicle module" as it is mounted on vehicles.

The control unit of the above-mentioned electric power steering unit and other power modules is required to discharge efficiently the heat generated thereby from the power module to control large current with a power element (semiconductor element) mounted thereon. In order to improve the dissipation of heat from the power module, semiconductor element represented by MOS (Metal-Oxide Semiconductor) are connected by die bonding with the power module in the form of bare chips (not sealed by resin and the like) on the substrate, As the form of electrical connection with semiconductor element mounted on the substrate of power modules, the Al wire bonding connection method used in other semiconductor modules has been used in the past. FIG. 1 shows an example of chip connection in the prior power modules. FIG. 1 is a sectional view showing conceptually by enlarging the part related with the chip connection of the power module, and the substrate (metal base substrate) 1 includes a metal base 1a, an insulation layer 1b covering the main surface of a side of the metal base 1a, and a wiring 1c formed by metal and other conductors on the insulation layer 1b (pad on the substrate side 1d). One side of the wiring 1c is connected by solder 2 with the lower surface of the semiconductor element 3 (one side of the main surface), and the upper surface of the semiconductor ship 3 (the other side of the main surface, opposite side of the main surface of the one side) and the other side of the wiring is electrically connected with Al wire. Incidentally, the system of coordinates shown in FIG. 1 specifies the main surface of the substrate 1 as x-y plane and defines the positional relationship between the structure shown in FIG. 1 and the structures in other figures described below. The x axis, the y axis and the z axis in this system of coordinates need not cross each other at right angle as long as they meet the condition of crossing each other.

As the bonding wire 4 used for connecting chips by Al wire bonding shown in FIG. 1 is slender, the resistance against current controlled by the chip necessarily grows higher. In order to avoid the rise in electric resistance in such chip connections, a plurality of wires must be connected to a MOS chip. And for mass producing power modules wherein such a chip connection method is adopted, the number of wire bonders and other similar equipment must be increased, and if the production of such power modules is to be increased, new capital investments will be required. Therefore, it is desired to realize chip connections in power modules not by wire bonding but by soldering leads producing a low resistance and suitable for the mass production of the power modules. FIG. 2 shows an example of power modules whose chips are connected with the lead. The upper surface of the semiconductor element 3 and the wiring 1c at the other end are respectively connected by solder 2 to the lead 6. And a heat spreader 5 is provided between the wiring 1c on the other end mentioned above and the lower surface of the semiconductor chip 3.

In order to realize such a lead connection of such semiconductor modules, the following technology is now under consideration. For example, Patent Document 1 teaches the method of connecting in layers a lead, semiconductor element, and a heat sink on the substrate by using a plurality of solders with different melting points, and that of connecting them in one stroke by using a Sn solder paste (containing mainly tin). This method simplifies the assembly process that will be necessarily complex by the wire bonding connection method. And Patent Document 2 examines how to improve the reliability of soldering by using a heat sink, an insulating substrate, silicon chips and a material with a linear expansion coefficient difference of $10 \times 10^{-6}$ or less. And Non-Patent Document 1 examines how to reduce thermal stress applied by the lead to the chips and to prevent the breakdown of chip electrodes by making the ends of the lead comb-teeth shaped.

[Patent Document 2]

[Non-patent Document 1]

The patent documents each referred above or later are listed as follows.

[Patent Document 1] Japanese Patent Publication Gazette No. 3627591

[Patent Document 2] Japanese Unexamined Patent Publication No. hei 9-36186 (JP-A No. 36186-1997)

[Non-Patent Document 1] Nakajima et al.: "Lead connected type high-capacity resin-sealed power module", 11$^{th}$ Symposium on "Microjoining and Assembly Technology in Electronics" (Mate 2005), Vol. 11 (2005), pp. 433-436.

SUMMARY OF THE INVENTION

FIG. 3 is a schematic view of external appearance of a MOS chip 3. The front surface of the MOS chip 3 shown in FIG. 3 corresponds to the upper surface of the semiconductor element 3 described above and the rear surface to the lower surface of the semiconductor element 3 described above. The MOS chip 3 includes a channel (for example an intrinsic semiconductor layer) formed in the z direction between a source electrode 8 on the front surface and a drain electrode 9 on the rear surface, and the conduction of the large current described above in this channel is controlled by the voltage signal impressed on a gate electrode 7 provided on the front surface of the MOS chip 3. On the front surface of the MOS chip 3 shown in FIG. 3, a gate electrode 7 and a plurality of source electrodes 8 are formed by being separated from each other. The rear surface, on the other hand, is wholly covered with a drain electrode 9. In the semiconductor module shown in FIG. 2, this drain electrode 9 is connected with the heat spreader 5 by the solder 2, and is electrically connected with the wiring 1c in the main surface of the substrate 1 (pad 1d on the substrate side) through the heat spreader 5.

For realizing electrical connections with this MOS chip 3, in order to prevent any drop in the electric characteristics of the whole module, the wiring must be connected with all the source pads (source electrodes) 8 of the MOS chip 3 formed in a split shape on the front surface. According to the Al wire bonding method, the connection of Al wire 4 with each of these source pads 8 leads to a connection that prevents any drop in electric characteristics. For realizing a lead connection, the lead 6 must have a width sufficient to reach all the source pads 8 and must be soldered.

For supplying solder between the chip 3 and the lead 6, the method of inserting a soldering sheet between them is suitable in view of its applicability. At this time, due to the variation of position of mounting the soldering sheet and the lead on the front surface of the MOS chip (a plurality of source pads 8), and the displacement of the soldering sheets and lead from the source pads (source electrodes) 8 resulting from the flux accompanying the reflow of the soldering sheets, a part of the source pad 8 (for example, its extremity) may not be wetted with the solder even after the solder has melted. In other words, in the front surface of the MOS chip 3, the wetting condition with the solder of the source pad 8 becomes uneven. The solder deforms in such a way that its surface may be smaller due to its surface tension.

As described above, when the solder wetting coverage in the source pads 8 and the amount of solder wetting the source pad 8 are unevenly distributed on the front surface of the MOS chip 3, the lead 6 due to be connected with the source pad 8 by the solder moves on the front surface of the MOS chip in response to the solder wetting coverage and the distribution of the solder. As a result, the position of the lead 6 in relation to the source pad 8 deviates from a position suitable for electrical connection between the lead 6 and the MOS chip 3.

An example of displacement actually occurred of the lead 6 in relation to the pad 8 due to a variation in the wetting condition of solders (appearance of a non-wetting region) on the front surface of the pad (electrode) 8 connected with the lead 6 is shown in FIG. 13. The prevention of such displacement of the lead 6 in relation to the pad 8 that may occur in such a way and that of defective electrical connection between the lead 6 and the pad 8 resulting from the same are the problem to be solved by the present invention.

Such a problem perceived by the inventors of the present invention has not been examined in the technical field related with the mounting of semiconductor modules. Patent Documents 1 and 2 and Non-patent Document 1 respectively propose a connecting method by using a lead for the purpose of simplifying the respective process, a lead material and a form of lead having a high reliability of connection. However, references to these documents are not sufficient to find a technology capable of solving the unevenness of wetting condition of solder on the front surface of pads (electrodes) and the displacement of the lead vis-a-vis the pad discovered by the inventors.

In view of the problem described above, the basic structure of the lead that characterizes semiconductor modules conceived by the inventors is shown in FIG. 4. FIG. 4 shows the disposition of the lead 6, the electrode (pad) 8 of the semiconductor element (MOS chip) 3 electrically connected therewith, the electrode (pad) 1d formed in the main surface of the substrate 1, and other electrodes 1d formed in the main surface of the substrate 1 on which the semiconductor element 3 is mounted in the x-y plane defined by the system of coordinates shown in FIG. 1, and the outline of the main surface of the substrate 1 and other structures formed on the main surface (insulating layer 1b and the like) are omitted.

In the main surface of the substrate 1 extending on the x-y plane, the electrodes 8 of the semiconductor element 3 to which a part of the lead 6 (for example an end of the lead 6) is connected are juxtaposed and extend along the x-y plane. And the other electrodes 1d to which the other parts of the lead 6 (parts other than the part mentioned above, for example, the other end of the lead 6) are connected extend along the x-y plane. The lead 6 is described as a plate or a film formed by a electrically conductive material having a main surface that extends along the x-y plane with one part mentioned above connected with the electrode 8 of the semiconductor element 3 and the other part mentioned above connected with the other electrodes id formed in the main surface of the substrate 1, and a thickness in the z axis direction (direction that crosses with the main surface). One side of the main surface of the lead 6 having such a form (in FIG. 2, the lower surface of the lead 6) is in contact with the solder supplied on the electrodes 8 of the semiconductor element 3 in one part mentioned above, and is in contact with the solder supplied on the other electrodes 1d formed in the main surface of the substrate 1 in the other part mentioned above. In the following description in this specification, the one part described above of the lead 6 is shown also as Region A and the other part mentioned above is shown also as Region B with reference to FIG. 4. The broken line 6' drawn on the main surface of the lead 6 shows, as shown in FIG. 2, a bending part of the lead 6 that appears when one end of this lead 6 is connected by the solder 2 to the upper surface of the semiconductor element 3 and the other end is connected by the solder 2 to the wiring 1c (corresponding to the electrode 1d) formed on the main surface of the substrate 1a.

As shown in FIG. 4, the lead 6 of the semiconductor module according to the present invention is characterized by the fact that the width a of the Region A (here the dimension in the X axis direction) is greater than or equal to the width b determined by one side and the other side separated and facing each other in the X axis direction of the electrode 8 (dimension in the X axis direction of the electrodes 8) formed in the main surface of the semiconductor 3 (along the x-y plane). The width of the lead 6 is defined for example as the dimension in the direction (X axis direction) crossing with the direction (Y axis direction) extending from the Region A to the Region B of the main surface. And when the electrodes 8 joined with the main surface of the Region A of the lead 6 are constituted by a plurality of conductive layers (unit electrodes) juxtaposed in the X axis direction, the width of the lead 6 is defined as the dimension of the plurality of conductive layers in the juxtaposition direction.

The width a of the lead 6 needs not meet the above-mentioned relationship (a≧b) with regards to the above-mentioned width b, and it is enough that the relationship is fulfilled at least in a part of the Region A. In other words, a part of the electrodes 8 joined with the lead 6 (Region A) may not be covered by the lead 6 and be exposed. When the main surface of the Region A of the lead 6 is extended from one end nearest to its Region B to the other end farthest from its Region B, the width a of the lead 6 is defined as the dimension of main surface of the Region A along the direction crossing the extending direction (here the X axis direction), and its value needs only be larger than or equal to the width b of the electrodes 8 mentioned above at least on one side from either one end side or the other end side of the main surface of the Region A. And when at least one of a plurality of conductive layers constituting an electrode 8 arranged in one direction (X axis direction) extends in a direction (Y axis direction) crossing with the juxtaposition direction (X axis direction), the Region A of the lead 6 is preferably formed so as to fulfill the relationship (a≧b) mentioned above at least on one side of both ends along the extending direction. When the Region A of the lead 6 is formed so as to fulfill the relationship (a≧b) mentioned above on both ends, a part of the electrode 8 mentioned above may be exposed, and for example a U-shaped notch may be formed between the both ends. The width a of the Region A of the lead 6 will be narrower than the width b mentioned above by the part where the notch has been formed.

When an electrode 8 is constituted by a plurality of conductive layers juxtaposed in one direction (X axis direction), the width b of the electrode 8 is defined along the juxtaposition direction of a plurality of conductive layers (the above-mentioned X axis direction). The width b of the electrode is defined as the total sum of, for example, the width of each of a plurality of conductive layers along the juxtaposition direction and the gaps separating a plurality of pairs of neighboring conductive layers along the juxtaposition direction. And the width b of the electrode is also defined as the distance between a pair of sides located on both ends defined along the juxtaposition side of the plurality of conductive layers. The "side" in each of a pair of conductive layers forming both ends of the electrode 8 mentioned above is defined as a side that does not face the other of the plurality of conductive layers and that extends in the direction crossing the juxtaposition direction mentioned above. When one end and the other end of the main surface of a semiconductor element (on which the conductive layer is formed) separated in the juxtaposition direction of a plurality of conductive layers are taken as the reference, the width b of the electrode is defined as the distance separating in the juxtaposition direction one side located the on one end side of the conductive layer nearest to the one end of the main surface from the other side located on the other end side of the other conductive layer nearest to the other end of the main surface.

On the other hand, when the lead B above is formed to extend from one end of the Region A side to the other end of the Region B side above along the extending direction, at least a notch extending to the main surface from the other end of the lead along the extending direction may be formed in the Region B of the lead to split the lead into a plurality of parts. The plurality of parts formed in the Region B of the lead are lined up in the direction crossing their extending direction in the main surface of the lead. Corresponding to the Region B of the lead thus split up, the electrode 1d to be connected therewith may be split up, and each of them may be soldered to one of a plurality of parts constituting the Region B of the above-mentioned lead corresponding thereto. At this time, the electrode 1d may be split up into a n number of conductive films corresponding to a n number of parts (n is an integer of three or more) formed by splitting the Region B of the lead.

One of the representative structures of semiconductor modules according to the present invention includes a substrate (1a) having the main surface wherein a wiring pattern (1c) including a first conductive film (1d) and a second conductive film (1d) is formed, a semiconductor element (3) electrically connected with the first conductive film (1d) and mounted on the main surface of the substrate (1a), and a lead (6) electrically connecting the second conductive film (1d) and the semiconductor element 3), and is characterized in that the lead (6) is disposed with its main surface facing the main surface of the substrate (6), the main surface of the lead (6) includes a first region (Region A) facing the main surface of the opposite side of "the main surface of the substrate (1a)" and a second region (Region B) facing the second conductive film of the semiconductor element (3), an electrode (8) is formed on the main surface of the semiconductor element (3) to be connected with solder (2) with the first region (Region A) of the main surface of the lead (6), the first region (Region A) of the main surface of the lead (6) extends in a first direction (Y axis direction) from its one end near the second region (Region B) to its other end far from the second region (Region B), and the first width (a) of at least a part of the first region (Region A) of the main surface of the lead (6) along the second direction (X axis direction) crossing the first direction is larger than or equal to the second width (b) of the electrode (8) soldered to the first region (Region A) along the second direction (X axis direction).

A typical semiconductor modules according to the present invention are described as follows.

(1) The semiconductor module comprises:
a substrate having a main surface on which a wiring pattern including a first conductive film and a second conductive film is formed;
semiconductor element electrically connected with the first conductive film and mounted on the main surface of the substrate; and
a lead electrically connecting the second conductive film and the semiconductor element,
wherein the lead is disposed so that its main surface faces the main surface of the substrate,
the main surface of the first lead includes a first region which faces a main surface of the semiconductor element in its opposite side with the main surface of the substrate and a second region facing the second conductive film,
an electrode soldered to the first region of the main surface of the lead is formed in the main surface of the semiconductor element,
the first region of the main surface of the lead extends in a first direction from one of ends thereof near the second region to another of ends thereof far from the second region, and
the first width of at least a part of the first region of the main surface of the lead along the second direction transverse to the first direction is greater than or equal to the second width of the electrode soldered to the first region along the second direction.

(2) In the semiconductor module of (1): a heat sink (heat dissipating member) is provided between the first conductive film and the semiconductor element; one of main surfaces of the heat sink is soldered to the main surface of the first conductive film in its opposite side with the main surface of the substrate; and another of the main surfaces of the heat sink is soldered to another main surface of the semiconductor element opposite to the main surface thereof, respectively.

(3) In any one of the semiconductor modules of (1) and (2): the electrode formed in the main surface of the semiconductor element comprises a plurality of conductive layers juxtaposed in the second direction from one to another of both ends of the main surface facing each other in the second direction; and the second width of the electrode is defined as the distance between a side of a first conductive layer positioned on the one end of the main surface of the semiconductor element and a side of a second conductive layer positioned on the another end of the main surface of the semiconductor element, when one of the plurality of conductive layers being nearest to the one end of the main surface of the semiconductor element is taken as the first conductive layer, while the other one of a plurality of conductive layers being nearest to the other end of the main surface of the semiconductor element is taken as the second conductive layer.

(4) In the semiconductor module of (3): the plurality of conductive layers constituting the electrode of the semiconductor are formed extending longer in the first direction than the second direction.

(5) In any one of the semiconductor modules of (1) through (4): the lead is formed extending in the first direction from one end thereof by the side of the first region to the other end thereof by the side of the second region; the second region of the lead is divided into a plurality of parts separated by at least a notch extending in the first direction from the other end of the lead to the main surface of the lead; and the plurality of parts constituting the second region are juxtaposed in the second direction in the main surface of the lead.

(6) In the semiconductor module of (5): the second conductive film is divided into a plurality of parts juxtaposed in the second direction in the main surface of the substrate; and each part of the plurality of parts formed by dividing the second conductive film is soldered to one of the plurality of parts constituting the second region of the lead corresponding thereto.

(7) In the semiconductor module of (6): the second region of the lead is comb-teeth shaped with a n number (n is an integer of three or more) of the parts constituting the second region juxtaposed in the second direction; and the n number (n is an integer of three or more) of the parts constituting the second conductive film is juxtaposed in the second direction in the main surface of the substrate.

(8) In any one of the semiconductor modules of (1) through (5): the first width along the second direction of the first region of the main surface of the lead is larger than or equal to the second width along the second direction of the electrode of the semiconductor element soldered to the first region, in the whole region of the first region extending from the one of ends thereof near the second region to the another of ends thereof far from the second region.

(9) In any one of the semiconductor modules of (1) through (5): the first width along the second direction of the first region of the main surface of the lead is larger than or equal to the second width along the second direction of the electrode of the semiconductor element soldered to the first region, in at least one of a part of the first region by the side of the one of ends thereof near the second region and another part of the first region by the side of the another of ends thereof far from the second region; and the first width in the first region of the main surface of the lead other than the at least one of the parts is narrower than the second width.

(10) In the semiconductor module of (9): the first width along the second direction of the first region of the main surface of the lead is wider than or equal to the second width along the second direction of the electrode of the semiconductor element soldered to the first region, in respective parts of the first region by the side of the one of ends thereof near the second region and by the side of the another of ends thereof far from the second region; at least a notch extending in the second direction is formed in the other part of the first region of the main surface of the lead sandwiched between the respective parts thereof; and a part of the electrode of the semiconductor element is exposed due to the notch formed in the first region of the main surface of the lead.

(11) In the semiconductor module of (9): a control electrode which inputs signals for controlling the current flowing between the electrode formed on the main surface and the first conductive film in the main surface of the substrate through the semiconductor element is formed on the main surface of the semiconductor element; and the control electrode faces the first region of the lead other than the at least one of the parts thereof in the second direction through a gap in the main surface of the semiconductor element.

According to the structure of the semiconductor module according to the present invention described above, even if the wetting condition of the solder 2 is uneven in the electrode 8 formed on the main surface of the semiconductor element 3 mentioned above, as soon as the solder 2 begins reflowing, the solder 2 that had been localized in a part of the electrodes 8 spreads to other parts of the electrodes 8 in "a defective wetting" condition through the main surface of the Region A of the lead 6. As a result, the difference in wetting expansion of solder 2 in the contact surface between the electrodes 8 and the lead 6 is sufficiently reduced before the force applied by the reflowed solder 2 to the lead 6 grows larger. This is considered due to the phenomenon of an expansion of the width of at least a part of the lead 6 to more than or equal to the width of the electrode 8 accelerates the wetting expansion of the solder 2 in the main surface (Region A) of the lead 6 prior to the reflow of the solder 2 between the electrodes 8 and the lead 6. Therefore, it is not exaggerating to say that the wetting of the solder 2 begins spreading evenly throughout the electrodes 8 at the time when the reflow of the solder 2 turns full-fledged between the electrode 8 and the lead 6. By causing a genuine reflow of wet solder 2 in a part of the electrodes 8, it is possible to limit the phenomenon of the lead 6 moving with the other parts of the electrodes 8 with insufficient wetting of the solder 2 serving as a fulcrum, and the displacement of the lead 6 in relation to the electrodes 8 (semiconductor element 3) resulting from the phenomenon can be dissolved. And as the ratio of the region contributing to the electrical connection with the lead 6 in the main surface of the electrodes 8 facing the lead 6 rises drastically, the connection resistance between the lead 6 and the electrodes 8 can be contained. Therefore, even if the current controlled by the semiconductor element 3 increases, any excessive rise in temperature of the semiconductor module can be contained.

The effect of the semiconductor module of the present invention described above is made more apparent as the Region B of the main surface of the lead 6 is split into a plurality of parts. In particular, when the main surface of the lead 6 extends from its Region A to its Region B, the reflow of the solder 2 between the Region B of the lead 6 and the electrodes 1$d$ on the main surface of the substrate is thought to aid the "displacement" of the Region B of the lead 6 in relation to the electrodes 8. The split up of the Region B of the lead 6 into a plurality of parts enables to restrain the rotation of the lead 6 in the main surface of the substrate 1 due to the reflow of the solder 2 between the Region B and the electrodes 1$d$ on the main surface of the substrate. This effect is enhanced by splitting up the electrode 1$d$ on the main surface of the substrate in accordance with the shape of the Region B of the lead 6. For example, when each of the n number (n is an integer of three or more) of parts constituting the comb-teeth shaped Region B of the lead 6 is joined with one corresponding to each part of the n number of conductive films constituting the electrode 1$d$ on the main surface of the substrate, not only the "displacement" of the Region A of the lead 6 vis-a-vis the electrodes 8 but also the "displacement" of the Region B of the lead 6 vis-a-vis the electrodes 1$d$ can be dissolved.

In any of the semiconductor modules according to the present invention, it is possible to obtain power modules having a lead connection part free from displacement of semiconductor element vis-a-vis electrodes and suitable in particular for controlling large current thanks to the characteristic structure of the lead 6 and the characteristic structure of the electrode 1d joined to the Region B of the lead.

BRIEF DESCRIPTION OF THE DRAWINGS

The above and other features and advantages of the present invention will become more apparent by describing in detail exemplary embodiments thereof with reference to the attached drawings in which:

FIG. 8 is a table summarizing the number of samples in which the displacement of the lead occurred after reflow in the lead I (basic structure) of the present invention;

FIG. 11 is a table summarizing the dimensions of the lead examined in the lead IV (valley fold structure) of the present invention;

FIG. 12 is a table summarizing the number of samples in which the displacement of the lead occurred after reflow in the lead II (the gate pad part removed), the lead III (partially large width structure), and the lead IV (valley fold structure) of the present invention;

FIG. 14 is a perspective view of an electric power steering unit as an example of electric apparatus with a power module mounted thereon and a sectional view showing the mounting position of the power module in the electric power steering unit.

DETAILED DESCRIPTION OF THE INVENTION

Figure 1:
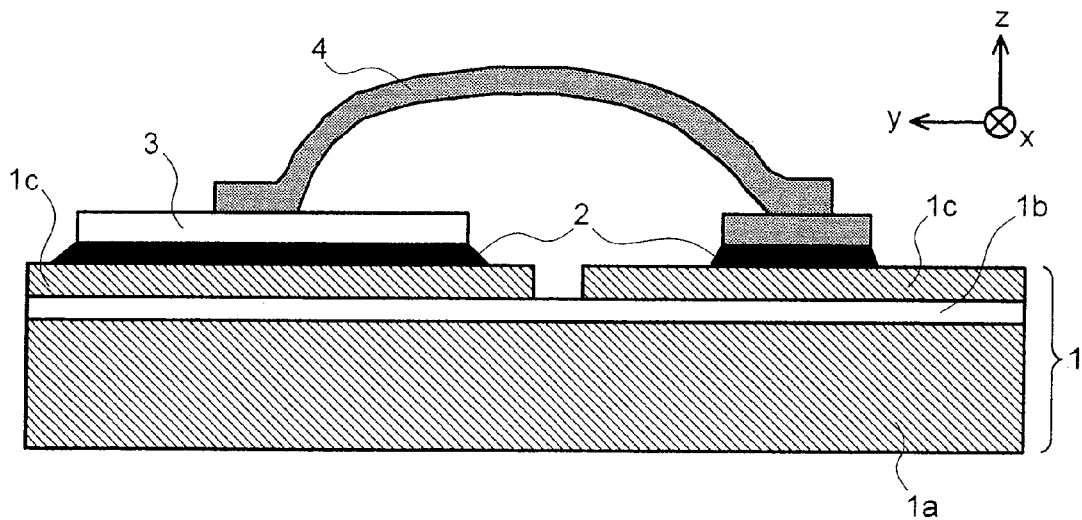
FIG. 1 is a sectional view showing an example of the chip connection part of a power module wherein the prior Al wire bonding connection method is used for wiring connection.
Figure 2:
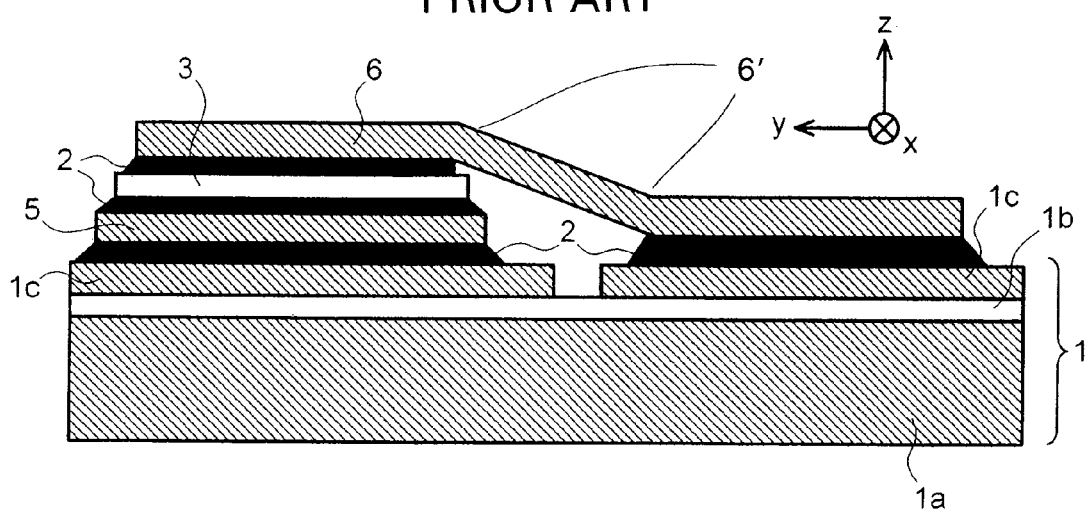
FIG. 2 is a sectional view showing an example of the chip connection part of a power module wherein the lead connection method is used for wiring connection.
Figure 4:
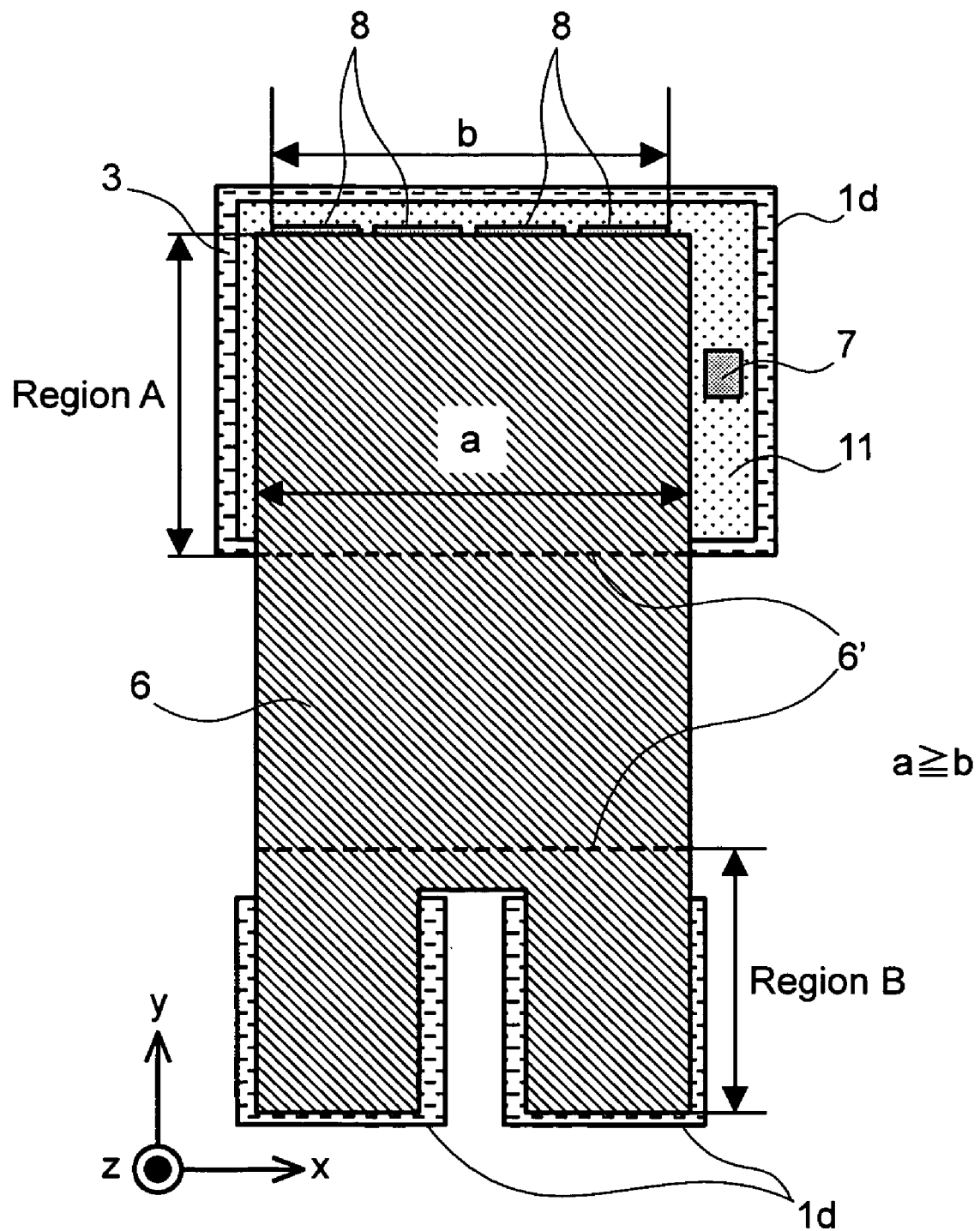
FIG. 4 is a schematic top plan view showing the basic structure of the lead in the present invention.
Figure 5:
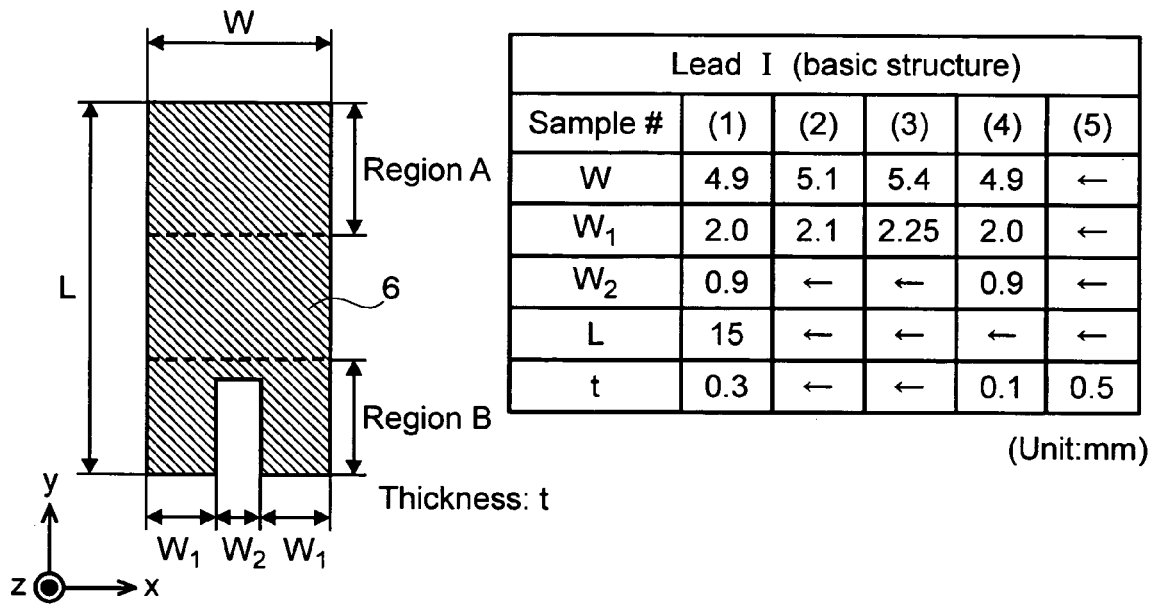
FIG. 5 is a table summarizing the dimensions of the lead examined in the lead 1 (basic structure) of the present invention.
Figure 10:
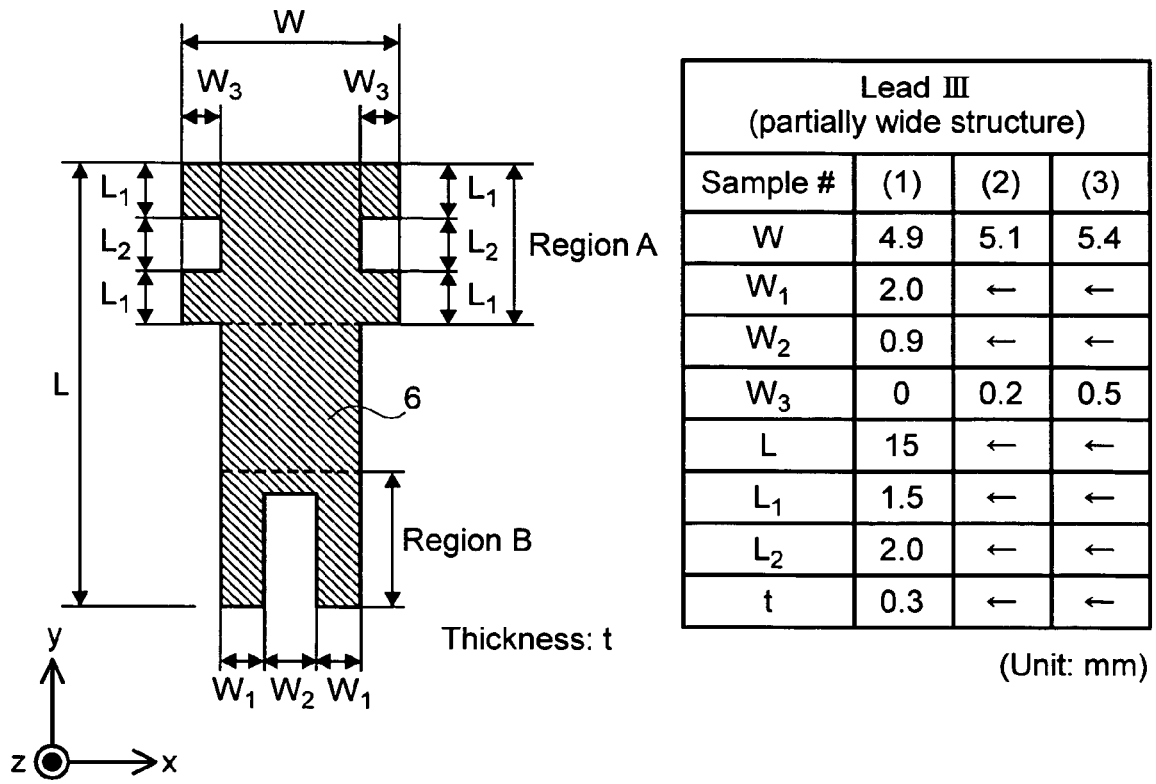
FIG. 10 is a table summarizing the dimensions of the lead examined in the lead III (partially large width structure) of the present invention.
Figure 13:
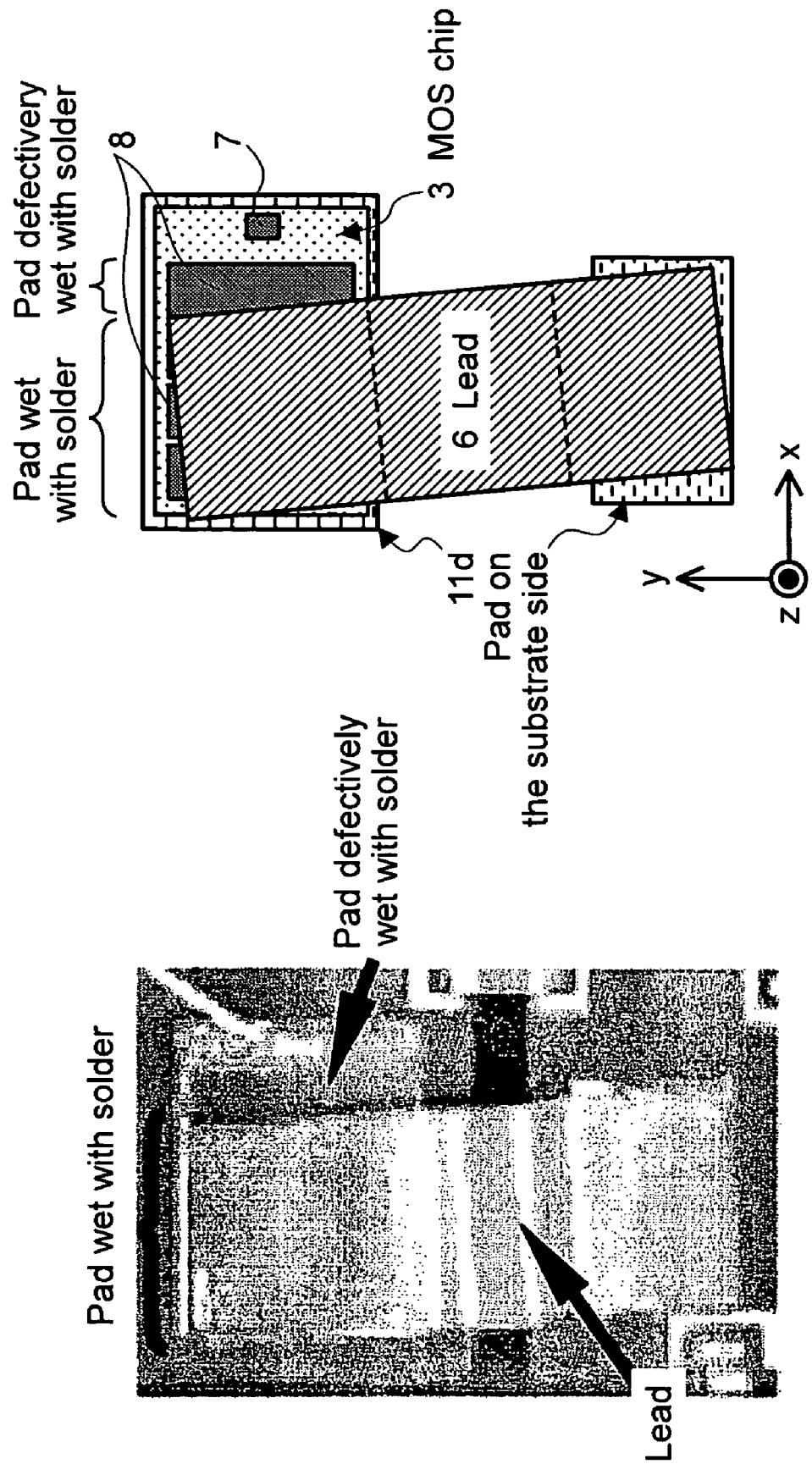
FIG. 13 is an illustration showing examples of uneven solder wetting distribution and displacement of the lead vis-a-vis the source pads actually occurred in the chip connection part of the power module wherein the lead connection method is used for wiring connection.

We will describe below the specific structures characterizing the semiconductor modules according to the present invention with reference to the related drawings for the following embodiment. In the semiconductor module described for this embodiment, we will refer from time to time FIG. 2 with regards to the structure common with the prior semiconductor modules. And the system of coordinates shown respectively in the drawings referred in the following embodiments, like the system of coordinates shown in FIG. 1, specifies the main surface of the substrate 1 of the semiconductor module as the x-y plane and defines the positional relationship of the members and structure shown in the respective drawings. For example, the lead 6 shown as the x-y plane in FIG. 5, FIG. 10 and FIG. 11 is joined with the main surface (electrode 8) of the semiconductor element 3 shown as the x-y plane in FIG. 6 as respectively shown as x-y plane in FIG. 4 and as y-z plane in FIG. 2. Incidentally, in any system of coordinates, the x axis, y axis and z axis need not cross at the right angle as long as they meet the required relationship of crossing each other.

Embodiment 1

In this embodiment, based on the following examination related to five types of lead 6 produced on the trial basis in order to prevent respectively uneven distribution of solder 2 wetting in the electrodes 8 (hereinafter referred to as "source pad 8") formed on the main surface of the semiconductor element 3 and joined with the lead 6 by the solder 2 and the displacement of the lead 6 in relation with the source pad 8, we will describe the specific structure of the semiconductor module according to the present invention.

Figure 3:
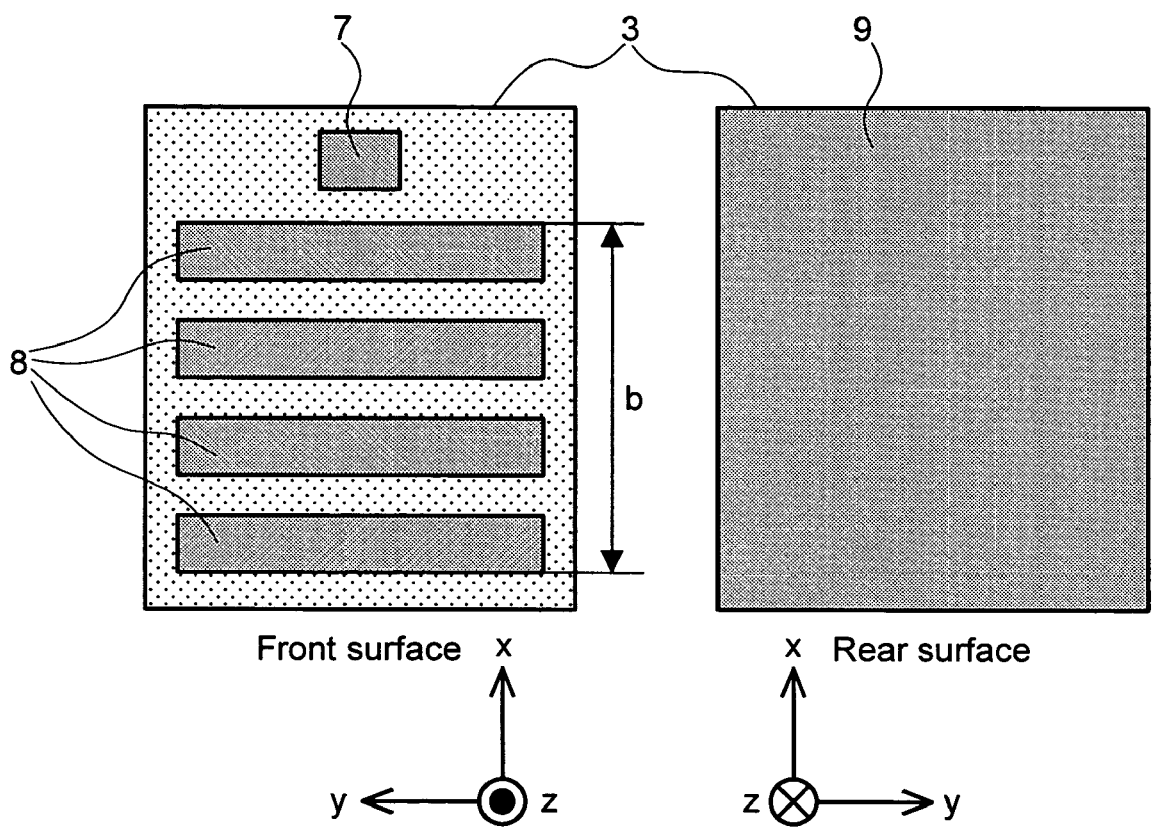
FIG. 3 is a schematic view showing the external appearance of the MOS chip used for examination in the present invention.
Figure 6:
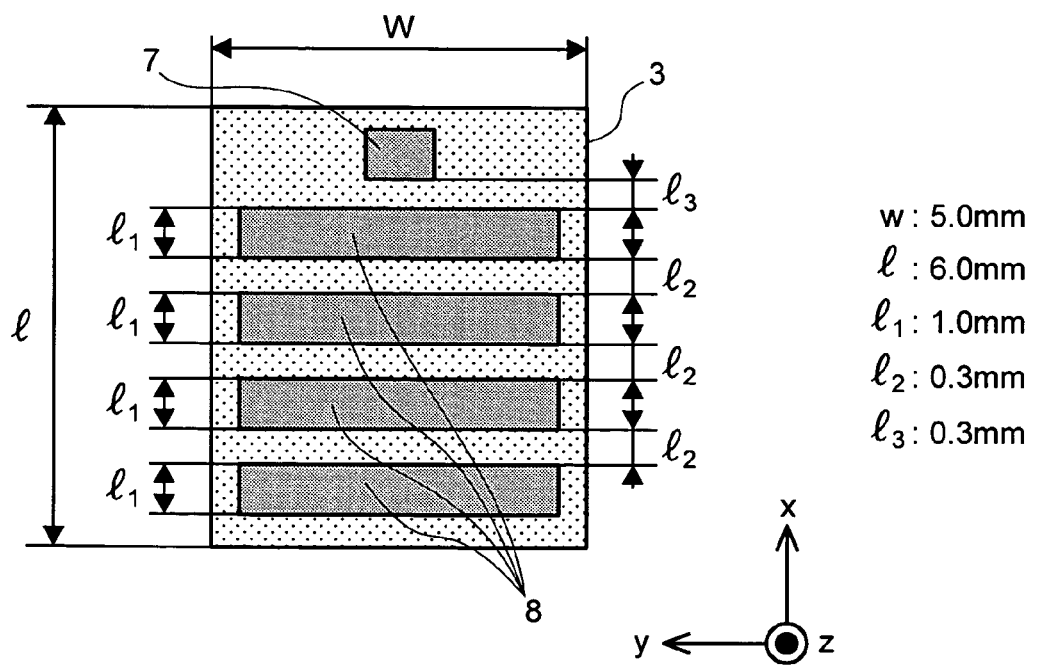
FIG. 6 is a table summarizing the external dimensions of the MOS chip examined and the dimensions of the electrode pads in the present invention.

Each of five types of lead 6 produced on the trial basis is common in terms of the shape of the main surface as shown in FIG. 5 and is classified in a group called "lead 1." The main surface of the semiconductor element 3 joined with the Region A of each lead 6 (upper surface in FIG. 2) is shown as a chip specification of TEG (Test Element Group) in FIG. 6. The TEG chip (semiconductor element) 3, like the MOS chip 3 shown in FIG. 3, includes a channel formed by for example an intrinsic semiconductor layer in the z direction between the source pad (source electrode) 8 formed on the main surface on one side (surface shown in FIG. 6) and the drain pad (drain electrode) formed on the main surface of the other side (surface located on the rear side of FIG. 6). The conduction of current in this channel is controlled by the voltage signals impressed onto the gate pad (gate electrode 7) provided on the main surface on the one side of the TEG chip. In other words, the TEG chip 3 used in this embodiment is constituted as a field effect transistor for switching the current flowing in the thickness direction. And even if this TEG chip 3 is constituted as a bipolar transistor wherein its source electrode is replaced by one of the emitter electrode and the collector electrode, its drain electrode is replaced by the other of the emitter electrode and the collector electrode and its gate electrode is replaced by the base electrode, the realization of the semiconductor module according to the present invention is not impeded.

Regarding the five types of lead 6 belonging to the "lead 1" group used in this embodiment, in order to study the impact of the width of the lead 6 (the width a of the Region A referred to with reference to FIG. 4) and its weight in the assembly of the semiconductor module according to the present invention, we conducted experiments of connection with the source pad 8 provided in the TEG chip 3 shown in the table attached to FIG. 6 by changing the lead width and the lead thickness for each sample as shown in FIG. 5. The sectional structure of the semiconductor module produced on the trial basis for the experiment in the Z axis direction is similar to that of a prior product shown in FIG. 2, and the plane structure in the x-y plane (the main surface of the substrate 1a) corresponds to that shown in FIG. 4. Taking into account workability in this experiment, we used Sn3Ag0, 5Cu soldering paste, a kind of lead-free solder for joining the chip 3 and the substrate 1 and the lead 6 and the substrate 1, and a lead-free soldering sheet having a composition similar to the soldering paste for example for joining the chip 3 and the lead 6. A polyimide film (an insulating film) 11 surrounding the gate pad (gate electrode 7) and the source pad (source electrode) 8 is formed on an upper surface the TEG chip (MOS chip) 3.

Figure 7:
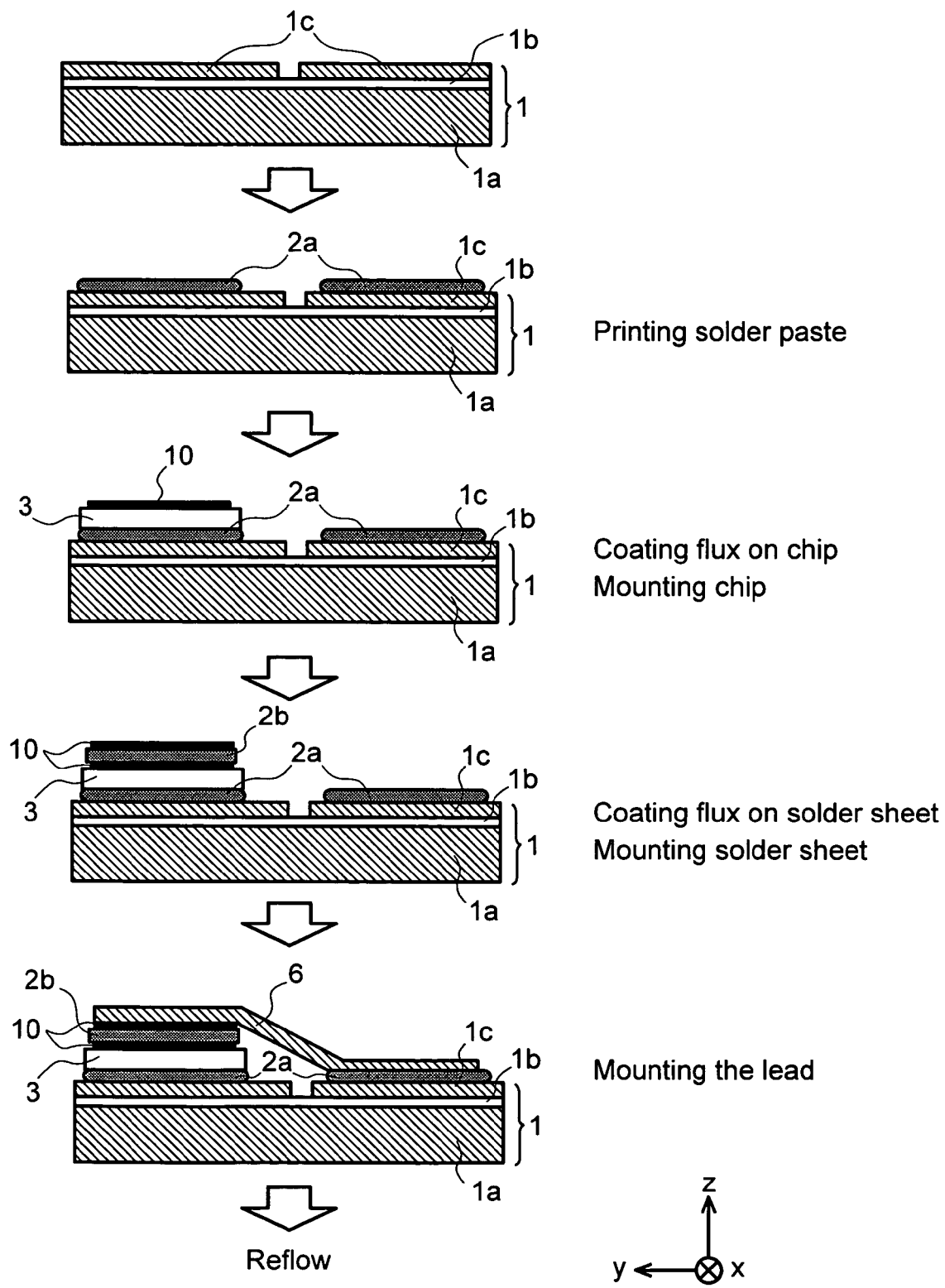
FIG. 7 is an illustration summarizing the experiment procedure adopted in the present invention.

In this embodiment, we produced the semiconductor module mentioned above by the procedure shown in FIG. 7. In the first place, we formed an insulation layer 1*b* on one side of the main surface of a metal base 1*a* made from a metal such as aluminum or an alloy containing the same. From the viewpoint of enhancing the heat resistance of the semiconductor module and insulating the current controlled thereby, we formed the insulation layer 1*b* by a thick film made by sintering ceramics for example. On the insulation layer 1*b*, we formed the pattern of wiring 1*c* made of a metal such as copper or aluminum or an alloy containing the same (a part of the same is used as a pad 1*d* on the substrate side). In addition, we applied a soldering paste 2*a* on the upper surface of the wiring 1*c*, and we mounted one of the above-mentioned TEG chip (semiconductor element) 3 on the soldering paste 2*a* applied on the upper surface of one of the wirings 1*c* (the first electrode). Furthermore, we applied flux 10 on the upper surface of the TEG chip 3 (region wherein the source pad 8 shown in FIG. 6 is formed), mounted a soldering sheet 2*b* on the flux 10, and applied flux 10 on the soldering sheet 2*b*.

We chose the size of the soldering sheet 2*b* corresponding to the area of the whole source pads (including the gaps among the source pads 8) so that it may cover the whole area of the plurality of source pads 8 split formed on the upper surface of the TEG chip 3. And to study the impact of variations in the position of supplying the soldering sheet 2*b* on the source pads 8, we shifted the supply position of the soldering sheet by 0 mm (no displacement), 0.2 mm and 0.5 mm in relation to the source pads 8.

After applying flux 10 on the soldering sheet 2*b*, we arranged the sample of lead 6 described above on the substrate (metal base substrate) 1 by adjusting the position of its Region A on the soldering sheet 2*b* with flux 10 applied thereon and the position of its Region B on the soldering paste 2*a* applied on the other one of the wiring 1*c* (the second electrode) by putting them together respectively. We placed the lead 6 on the substrate 1 by shifting the position of its supply to the source pad 8 respectively by 0 mm (no displacement), 0.2 mm and 0.5 mm in order to study the impact of the displacement on the source pads 8 of its Region A.

We prepared five samples of the semiconductor module produced on the trial basis for this embodiment for each group of different positions of soldering sheet 20*b* in relation to the source pad 8 mentioned above and different position of lead to each of the above-mentioned five sample types of lead 6. After the lead 6 was placed on its substrate 1, the samples of these semiconductor modules were placed in a reflow furnace, and the joining between the chip 3 and the first electrode 1*c* by the reflow of the soldering paste 2*a* above, the joining between the lead 6 and the second electrode 1*c* and the joining between the chip 3 and the lead 6 by the reflow of the soldering sheet 2*b* above were completed. The reflow conditions in the reflow furnace included a maximum temperature of 245° C., and we continued its heating with a melting point of the solder of 217° C. or more for 3 minutes and 20 seconds.

FIG. 8 shows the results of the experiments. FIG. 8 shows that in all the samples of semiconductor module produced on the trial basis for this embodiment there were no uneven solder wetting on the source pad 8 and that no displacement of lead 6 occurred in relation to the source pads 8. The marking "0/5" entered in the table of FIG. 8 shows that all the five samples of semiconductor modules were good. As is evident from the table attached to FIG. 6, the width of the whole source pads 8 of the TEG chips (semiconductor element) 3 used in this embodiment (corresponding to the width b referred to in FIG. 4) is calculated to be 4.9 mm based on the width $1_1$=1.0 mm in the X axis direction of each of four source pads 8 and the width $1_2$=0.3 mm of a gap separating in the X axis direction the source pads 8. On the other hand, as is evident from the table attached to FIG. 5, the width W of the samples # (1), (4) and (5) (corresponding to the width a referred to in FIG. 4) of the lead 6 used in this embodiment is equal to the width b of the whole source pads 8, and the width W of the samples # (2) and (3) is larger than the width b of the whole of the source pads 8. In addition, the thickness of the lead 6 (factor affecting the dimension in the Z axis direction and the weight of the lead 6), and the impact of displacement of the lead 6 and the soldering sheet 2*b* vis-a-vis the source pads 8 cannot be found.

In view of the above, when the lead 6 has a width a (=W) larger than or equal to the width b of the whole of the electrode 8 joined thereto by the solder 2*b* in its Region A, it has become clear that the problem of uneven solder wetting in the electrodes 8 of the semiconductor element 3 mounted on the semiconductor module is solved by using the lead 6 in the semiconductor module, and that the outbreak of any displacement of the lead 6 vis-a-vis the electrodes 8 can be contained.

On the other hand, when the Region B of a lead 6 extending in the Y axis direction from one end of the Region A side to the other end of the Region B side is separated by a "notch" extending in the Y axis direction from the other end, and is split into two parts juxtaposed in the X axis direction, the effect described above was observed more clearly. And the effect described above could also be clearly observed by, in addition to the Region B thus formed of the lead 6, splitting the second electrode 1*d* of the substrate 1 joined with the Region B into two conductive films juxtaposed in the X axis direction in the main surface of the substrate 1. Moreover, it was confirmed that the effect of the lead 6 characterized by the shape of the Region A above can be enhanced by splitting the Region B of the lead 6 into n number (n is an integer of three or more) of parts and forming a so-called comb-teeth shaped part and by soldering each of the "parts" with each one corresponding to the "parts" of a n number of the conductive films juxtaposed in the X axis direction on the substrate 1 and constituting the second electrodes 1*d*.

Therefore, a semiconductor module (power module) suitable for controlling a large current can be obtained by using the lead 6 described in this embodiment.

Embodiment 2

Figure 9:
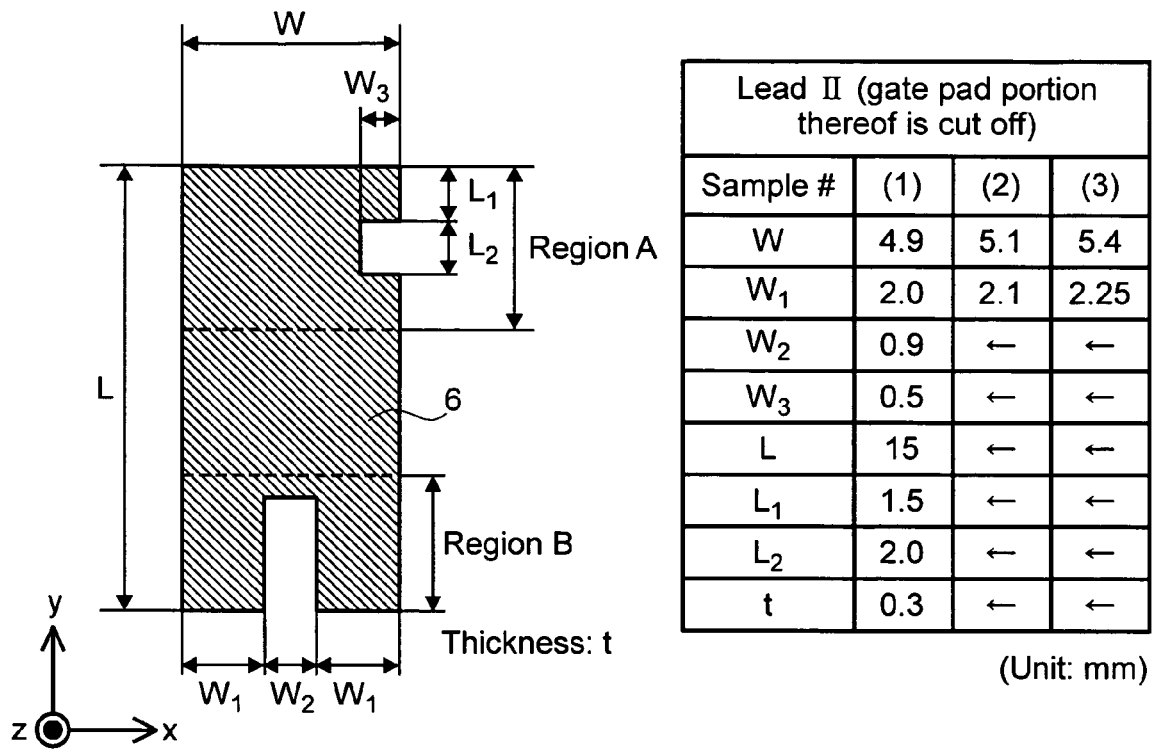
FIG. 9 is a table summarizing the dimensions of the lead examined in the lead II (the gate pad part removed) of the present invention.

In this embodiment, in the place of a lead of the "lead I" group produced on the trial basis for the embodiment 1, we produced samples of lead 6 having a main surface (x-y plane) of different shapes from the same classifying them according to their shape into the groups "lead II" (see FIG. 9), "lead III" (see FIG. 10) and "lead IV" (see FIG. 11) and examined their feasibility in the semiconductor module. Also in this embodiment, we used the TEG chip shown in FIG. 6 as a semiconductor element 3 joined to these leads 6, and we followed an assembly process of the semiconductor module similar to the process of the embodiment 1 described with reference to FIG. 7 and we set the reflow conditions for the soldering paste 2*a* and the soldering sheet 2*b* in the same way as that of the embodiment 1.

The lead 6 examined in the embodiment 1 fulfills the required relationship that the width a of Region A of its main surface extending in the X axis direction is larger than or equal to the width b (=4.9 mm) along the X axis direction of the electrodes (source pads) 8 of the semiconductor element 3 to be soldered to the Region A in the "whole area" extending from "the nearest end to the Region B" of the Region A to "the other end farther from the Region B." However, in the samples # (1) and (2) of the "lead II" and the samples # (2) and (3) of the "lead III" examined in this embodiment, in respective Region A, the above-mentioned relationship (a≧b) is not partially fulfilled. In other words, when the Region A of these samples is divided into one end side whose length in the Y axis direction from its Region B side is $L_1$, the central part whose length in the Y axis direction from its Region B side is $L_2$, and the other end side whose length in the Y axis direction from its Region B side is $L_1$, the width a (=W−$W_3$) of the central part of the sample # (1) of the "lead II" is 4.5 mm, the width a of the central part of the sample # (2) of the "lead II" and the width a (=W−2×$W_3$) of the central part of the sample # (2) of the "lead III" are 4.7 mm, and the width a of the central part of the sample # (3) of the "lead III" is 4.4 mm, and they are all smaller than the width b of the electrodes 8 of the semiconductor element 3. The characteristic common to these leads 6 (samples) is that the width (hereinafter referred to as "the first width") a along the X axis direction in the Region A of the main surface in "at least one part" of one end side near the Region B (one end side part) and the other end side far from the Region B (the other end side part) is larger than or equal to the width (hereinafter referred to as "the second width") b along the X axis direction of the electrodes 8 of the semiconductor element 3 to be soldered to the Region A, and the first width a in the part other than "at least one part" of the Region A of the main surface of the lead is smaller than the second width b above. Incidentally, the sample # (1) of the "lead III" is equal to the sample # (1) of the "lead I" in terms of each of thickness (dimension in the t and x axis direction), the total length (L) along the Y axis direction, the length of the Region A (2×$L_1$+$L_2$), the length and the split structure of the Region B.

Regarding the samples # (1)-(3) of the "lead II", the samples # (2) and (3) of the "lead III" and the sample # (1) of the "lead IV" examined in this embodiment, as the comparison of the central part, the one end part and the other end part in respective Region A shows clearly, the first width a along the X axis direction of the Region A of the main surface of the lead is larger than or equal to the second width b along the X axis direction of the electrodes 8 of the semiconductor element 3 to be soldered to the Region A, respectively in one end side and the other end side, and at least a notch extending in the X axis direction is formed in the other part sandwiched between one end side and the other end side of the Region A of the main surface of the lead (the central part mentioned above) In the semiconductor module with such leads 6 (samples), as shown in FIG. 11, a part of the electrodes (source pads) 8 of the semiconductor element 3 mentioned above may be exposed due to the presence of the notch formed in the Region A of the main surface of the lead. The "notch" formed in the main surface of the lead 6 is preferably formed in the U shape or trench shape in the X axis direction.

It is recommended to create the "notch" in the main surface of the lead (Region A) at a position where the control electrode (gate pad) 7 of the semiconductor element 3 formed in the main surface faces the notch through a gap in the X direction within the main surface (x-y plane) of the semiconductor element 3 where the electrodes (source pads) 8 are formed. For example, when the wiring (conductive film, not shown in any figure) other than the first electrode 1c (the first conductive film) 1d formed in the main surface of the substrate 1 and the second electrode 1c (the second conductive film) 1d and the control electrode 7 of the semiconductor element 3 are electrically connected by wire bonding, the notch formed in the Region A of the main surface of the lead facilitate the positioning of the wire bonder in the main surface of the control electrode 7 and reduces the risk of short circuits between the bonding wire (not shown) and the lead 6.

Like the embodiment 1, as samples of semiconductor module examined in this embodiment, we prepared three types with different position of supplying the soldering sheet 20b to the source pads 8 for each seven types of lead 6 used for the same, and we prepared three types with different arrangement of the Region A of the lead 6 for the source pads 8 for each condition of three types with different positioning between the soldering sheet 20b and the source pads 8. We prepared five samples for each of 63 types of semiconductor modules thus classified, and counted the number of defective samples that occurred for each type and summarized the results in a table shown in FIG. 12.

FIG. 12 contains tables that summarize the results of examination of articles made on an experimental basis in the 63 types of semiconductor modules in the same way as FIG. 8. The results of examination are shown by fractions with the total number of samples (=5) as the denominator and the number of defective samples for the total number as the numerator. In any type of semiconductor module, there were no defective samples as the results marked "0/5" indicate.

From the facts described above, it has become clear that uneven solder wetting in the electrodes 8 of the semiconductor element 3 mounted on a semiconductor module will be dissolved even if the first width a in the Region A of the lead 6 is neither larger than nor equal to the second width b of the electrodes 8 connected therewith by the solder 2b in the whole Region A as long as the required relationship (a≧b) is fulfilled at least in a part of the Region A. And it has become clear that the occurrence of displacement of the lead 6 vis-a-vis the electrodes 8 of the semiconductor element 3 will be contained in the semiconductor module shown in this embodiment also.

And the above-mentioned effect was more clearly recognized when, in any main surface extending in the Y axis direction from one end on the Region A side to the other end on the Region B side of the three types of lead 6 examined in this embodiment, the Region B was separated by a "notch" extending from the other end in the Y axis direction and was split into two parts juxtaposed in the X axis direction in the main surface of the substrate 1. And the above-mentioned effect was clearly recognized when the second electrode 1d of the substrate 1 to be connected with the Region B was split into two conductive films juxtaposed in the X axis direction corresponding to the Region B of the lead 6 thus formed. And it was also confirmed that the effect of the lead 6 characterized by the shape of the Region A will be enhanced by splitting the Region B of the lead 6 in a n number (n is an integer of three or more) of parts and soldering each of the "parts" with each one corresponding to the "parts" of a n number of conductive films juxtaposed in the X axis direction in the substrate 1 and constituting the second electrode 1d.

Therefore, various types of lead 6 described in this embodiment may be used to obtain semiconductor modules (power modules) suitable for controlling large current.

INDUSTRIAL APPLICABILITY

In the power module mounted on in-vehicle electric apparatuses, the lead connection for mounting the plate-shaped or film-shaped lead as mentioned above on the substrate by facing the main surface of the lead against the main surface of the substrate tends to increase in the future. Therefore, the problem of uneven solder wetting condition on the front surface of the electrodes (conductive films) soldered on the main surface of the lead to which the inventors paid attention and that of displacement of lead vis-a-vis the electrodes are likely to occur frequently in the future. The present invention provides a suitable and effective lead structure for solving these problems.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. A semiconductor module comprising:
   a substrate having a main surface on which a wiring pattern including a first conductive film and a second conductive film is formed,
   a semiconductor element electrically connected with said first conductive film and mounted on the main surface of said substrate, and
   a lead electrically connecting said second conductive film and said semiconductor element,
   wherein said lead is disposed so that its main surface faces the main surface of said substrate,
   wherein the main surface of said lead includes a first region which faces a main surface of said semiconductor element in its opposite side with the main surface of said substrate and a second region facing said second conductive film,
   wherein an electrode soldered to said first region of said main surface of said lead is formed in said main surface of said semiconductor element,
   wherein said first region of said main surface of said lead extends in a first direction from one of ends thereof near said second region to another of ends thereof far from said second region,
   wherein the first width of at least a part of said first region of said main surface of said lead along the second direction transverse to said first direction is greater than or equal to the second width of said electrode soldered to said first region along said second direction,
   wherein said electrode formed in said main surface of said semiconductor element comprises a plurality of conductive layers juxtaposed in said second direction from one to another of both ends of said main surface facing each other in said second direction, and
   wherein said second width of said electrode is defined as the distance between a side of a first conductive layer positioned on said one end of the main surface of said semiconductor element and a side of a second conductive layer positioned on said another end of the main surface of said semiconductor element, when one of said plurality of conductive layers being nearest to said one end of said main surface of said semiconductor element is taken as the first conductive layer, while the other one of a plurality of conductive layers being nearest to said other end of said main surface of said semiconductor element is taken as the second conductive layer.

2. The semiconductor module according to claim 1, wherein a heat sink is provided between said first conductive film and said semiconductor element,
   wherein one of main surfaces of said heat sink is soldered to the main surface of said first conductive film in its opposite side with the main surface of said substrate, and
   wherein another of the main surfaces of said heat sink is soldered to another main surface of said semiconductor element opposite to said main surface thereof, respectively.

3. The semiconductor module according to claim 1, wherein
   said plurality of conductive layers constituting said electrode of said semiconductor are formed extending longer in said first direction than said second direction.

4. The semiconductor module according to claim 1,
   wherein said lead is formed extending in said first direction from one end thereof by the side of said first region to the other end thereof by the side of said second region,
   wherein said second region of said lead is divided into a plurality of parts separated by at least a notch extending in said first direction from said other end of said lead to said main surface of said lead, and
   wherein said plurality of parts constituting said second region are juxtaposed in said second direction in said main surface of said lead.

5. The semiconductor module according to claim 1, wherein
   said first width along said second direction of said first region of the main surface of said lead is larger than or equal to said second width along said second direction of said electrode of said semiconductor element soldered to said first region, in the whole region of said first region extending from said one of ends thereof near said second region to said another of ends thereof far from said second region.

6. The semiconductor module according to claim 1,
   wherein said first width along said second direction of said first region of the main surface of said lead is larger than or equal to said second width along said second direction of said electrode of said semiconductor element soldered to said first region, in at least one of a part of said first region by the side of said one of ends thereof near said second region and another part of said first region by the side of said another of ends thereof far from said second region, and
   wherein said first width in said first region of the main surface of said lead other than said at least one of said part of said first region by the side of said one of ends thereof near said second region and another part of said first region by the side of said another of ends thereof far from said second region is narrower than said second width.

7. The semiconductor module according to claim 6,
   wherein said first width along said second direction of said first region of the main surface of said lead is wider than or equal to said second width along said second direction of said electrode of said semiconductor element soldered to said first region, in respective parts of said first region by the side of said one of ends thereof near said second region and by the side of said another of ends thereof far from said second region,
   wherein at least a notch extending in said second direction is formed in the other part of said first region of the main surface of said lead sandwiched between said respective parts thereof, and
   wherein a part of said electrode of said semiconductor element is exposed due to said notch formed in said first region of the main surface of said lead.

8. The semiconductor module comprising:

a substrate having a main surface on which a wiring pattern including a first conductive film and a second conductive film is formed, a semiconductor element electrically connected with said first conductive film and mounted on the main surface of said substrate, and a lead electrically connecting said second conductive film and said semiconductor element, wherein said lead is disposed so that its main surface faces the main surface of said substrate, wherein the main surface of said lead includes a first region which faces a main surface of said semiconductor element in its opposite side with the main surface of said substrate and a second region facing said second conductive film, wherein an electrode soldered to said first region of said main surface of said lead is formed in said main surface of said semiconductor element, wherein said first region of said main surface of said lead extends in a first direction from one of ends thereof near said second region to another of ends thereof far from said second region, wherein the first width of at least a part of said first region of said main surface of said lead along the second direction transverse to said first direction is greater than or equal to the second width of said electrode soldered to said first region along said second direction, wherein said lead is formed extending in said first direction from one end thereof by the side of said first region to the other end thereof by the side of said second region, wherein said second region of said lead is divided into a plurality of parts separated by at least a notch extending in said first direction from said other end of said lead to said main surface of said lead, wherein said plurality of parts constituting said second region are juxtaposed in said second direction in said main surface of said lead, wherein said second conductive film is divided into a plurality of parts juxtaposed in said second direction in said main surface of said substrate, and wherein each part of said plurality of parts formed by dividing said second conductive film is soldered to one of said plurality of parts constituting said second region of said lead corresponding thereto.

9. The semiconductor module according to claim 8, wherein said second region of said lead is comb-teeth shaped with a n number (n is an integer of three or more) of said parts constituting said second region juxtaposed in said second direction, and wherein said n number (n is an integer of three or more) of said parts constituting said second conductive film is juxtaposed in said second direction in said main surface of said substrate.

10. The semiconductor module comprising:

a substrate having a main surface on which a wiring pattern including a first conductive film and a second conductive film is formed, a semiconductor element electrically connected with said first conductive film and mounted on the main surface of said substrate, and a lead electrically connecting said second conductive film and said semiconductor element, wherein said lead is disposed so that its main surface faces the main surface of said substrate, wherein the main surface of said lead includes a first region which faces a main surface of said semiconductor element in its opposite side with the main surface of said substrate and a second region facing said second conductive film, wherein an electrode soldered to said first region of said main surface of said lead is formed in said main surface of said semiconductor element, wherein said first region of said main surface of said lead extends in a first direction from one of ends thereof near said second region to another of ends thereof far from said second region, wherein the first width of at least a part of said first region of said main surface of said lead along the second direction transverse to said first direction is greater than or equal to the second width of said electrode soldered to said first region along said second direction, wherein said first width along said second direction of said first region of the main surface of said lead is larger than or equal to said second width along said second direction of said electrode of said semiconductor element soldered to said first region, in at least one of a part of said first region by the side of said one of ends thereof near said second region and another part of said first region by the side of said another of ends thereof far from said second region, wherein said first width in said first region of the main surface of said lead other than said at least one of said part of said first region by the side of said one of ends thereof near said second region and another part of said first region by the side of said another of ends thereof far from said second region is narrower than said second width, wherein a control electrode which inputs signals for controlling the current flowing between said electrode formed on said main surface and said first conductive film in the main surface of said substrate through said semiconductor element is formed on said main surface of said semiconductor element, and wherein said control electrode faces said first region of said lead other than said at least one of the parts thereof in said second direction through a gap in said main surface of said semiconductor element.

* * * * *